US006627092B2

(12) United States Patent
Clements et al.

(10) Patent No.: US 6,627,092 B2
(45) Date of Patent: Sep. 30, 2003

(54) METHOD FOR THE FABRICATION OF ELECTRICAL CONTACTS

(75) Inventors: Bradley E Clements, Ft Collins, CO (US); Joseph M White, Windsor, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 272 days.

(21) Appl. No.: 09/917,093

(22) Filed: Jul. 27, 2001

(65) Prior Publication Data
US 2003/0019836 A1 Jan. 30, 2003

(51) Int. Cl.[7] .................. H01B 13/00; H01L 21/4763
(52) U.S. Cl. ............................ 216/13; 438/618
(58) Field of Search ................... 216/2, 13, 18, 216/11, 41; 138/612, 613, 618, 129; 29/874, 879, 884; 257/736, 750

(56) References Cited

U.S. PATENT DOCUMENTS 5,228,861 A * 7/1993 Grabbe .................. 439/66
5,802,699 A    9/1998 Fjelstad et al.
6,029,344 A * 2/2000 Khandros et al. ............ 29/874
6,442,039 B1 * 8/2002 Schreiber .................. 361/760
6,558,560 B2 * 5/2003 Clements et al. ............ 216/18

FOREIGN PATENT DOCUMENTS

JP          8287983     11/1996
WO      WO9100619      1/1991

* cited by examiner

Primary Examiner—Gregory Mills
Assistant Examiner—Roberts P Culbert
(74) Attorney, Agent, or Firm—Leslie P. Gehman

(57) ABSTRACT

A method for the fabrication of electrical contacts using metal forming, masking etching, and soldering techniques is presented. The method produces a plurality of specialized electrical contacts, capable of use in an interposer, or other device, including non-permanent or permanent electrical connections providing contact wipe, soft spring rates, durability, and significant amounts of travel.

14 Claims, 20 Drawing Sheets

METHOD FOR THE FABRICATION OF ELECTRICAL CONTACTS

FIELD OF THE INVENTION

This invention relates generally to the field of electrical contacts and more specifically to methods for the fabrication of electrical contacts.

BACKGROUND OF THE INVENTION

Existing electrical contact designs include interposers constructed from elastomeric material and interposers constructed from balls of wire. Both of these solutions have limitations inherent in their design. Current elastomeric materials are unable to sustain adequate contact spring force over time and temperature and have a small range of working heights. Interposers constructed from balls of wire are fragile, prone to unravel, often require costly inspection, and provide a limited amount of contact travel.

SUMMARY OF THE INVENTION

A method for the fabrication of electrical contacts using metal forming, masking etching, and soldering techniques is presented. The method produces a plurality of specialized electrical contacts, capable of use in an interposer, or other device, including non-permanent or permanent electrical connections providing contact wipe, soft spring rates, durability, and significant amounts of travel.

Other aspects and advantages of the present invention will become apparent from the following detailed description, taken in conjunction with the accompanying drawings, illustrating by way of example the principles of the invention.

DETAILED DESCRIPTION

Figure 1:
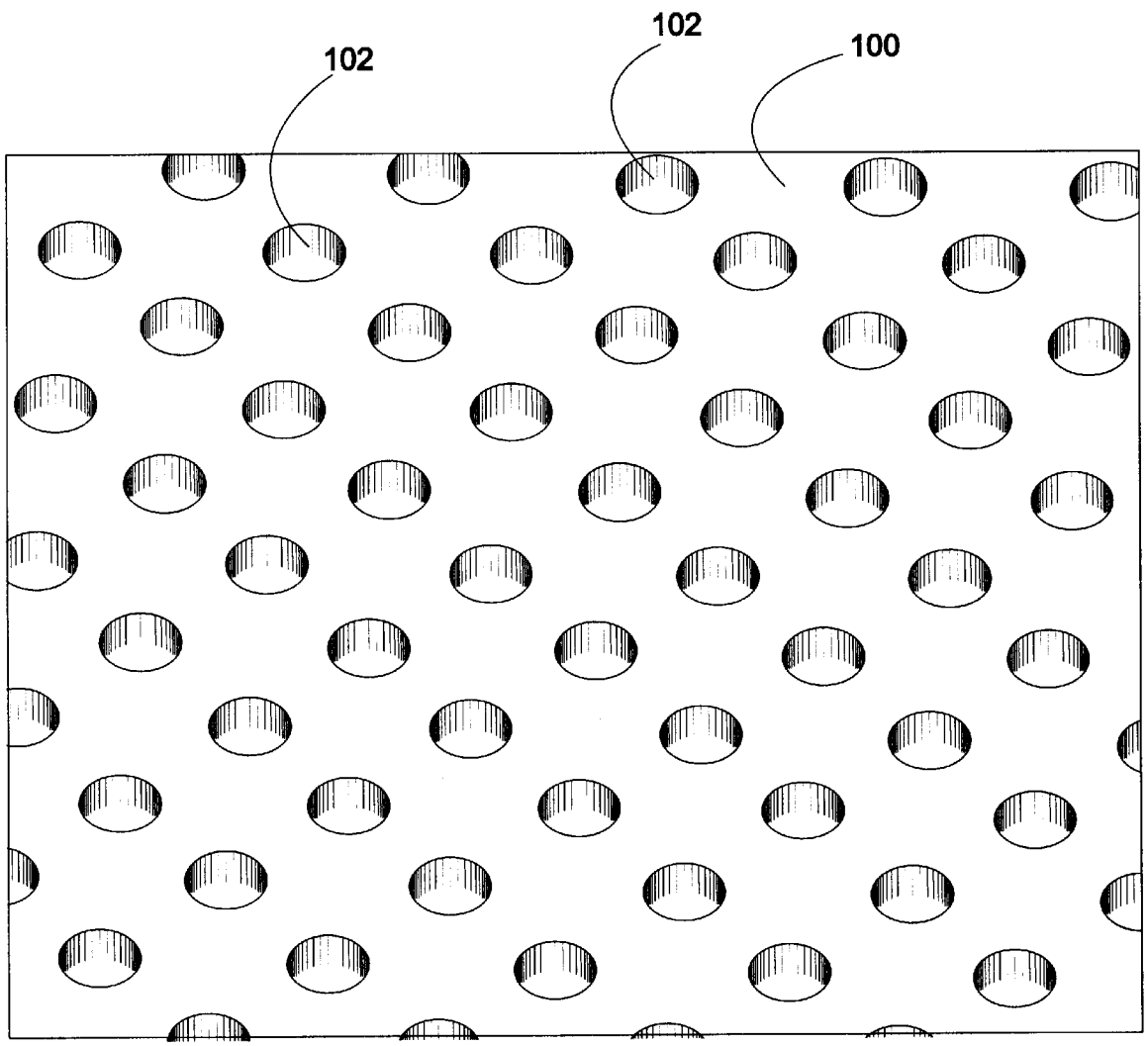
FIG. 1 is a perspective view of an embodiment of a substrate including an array of holes according to the present invention.

FIG. 1 is a perspective view of an embodiment of a substrate including an array of holes according to the present invention. A quantity of holes or vias 102 is created in a substrate 100. In an example embodiment of the present invention the holes may be drilled into a printed circuit board (PCB) substrate. In an example embodiment of the present invention using a PCB substrate, metal pads may be placed on the substrate surrounding the planned locations of the holes before the holes are drilled. Other methods of creating the holes, such as etching, and other substrate materials, such as ceramics, may be used within the scope of the present invention. The quantity of holes 102 does not need to form a regular array shown in FIG. 1. In other embodiments of the present invention, the holes may be irregularly spaced as desired for any particular design. The PCB substrate material is commonly fiberglass, however other materials may be used within the scope of the present invention.

Figure 2:
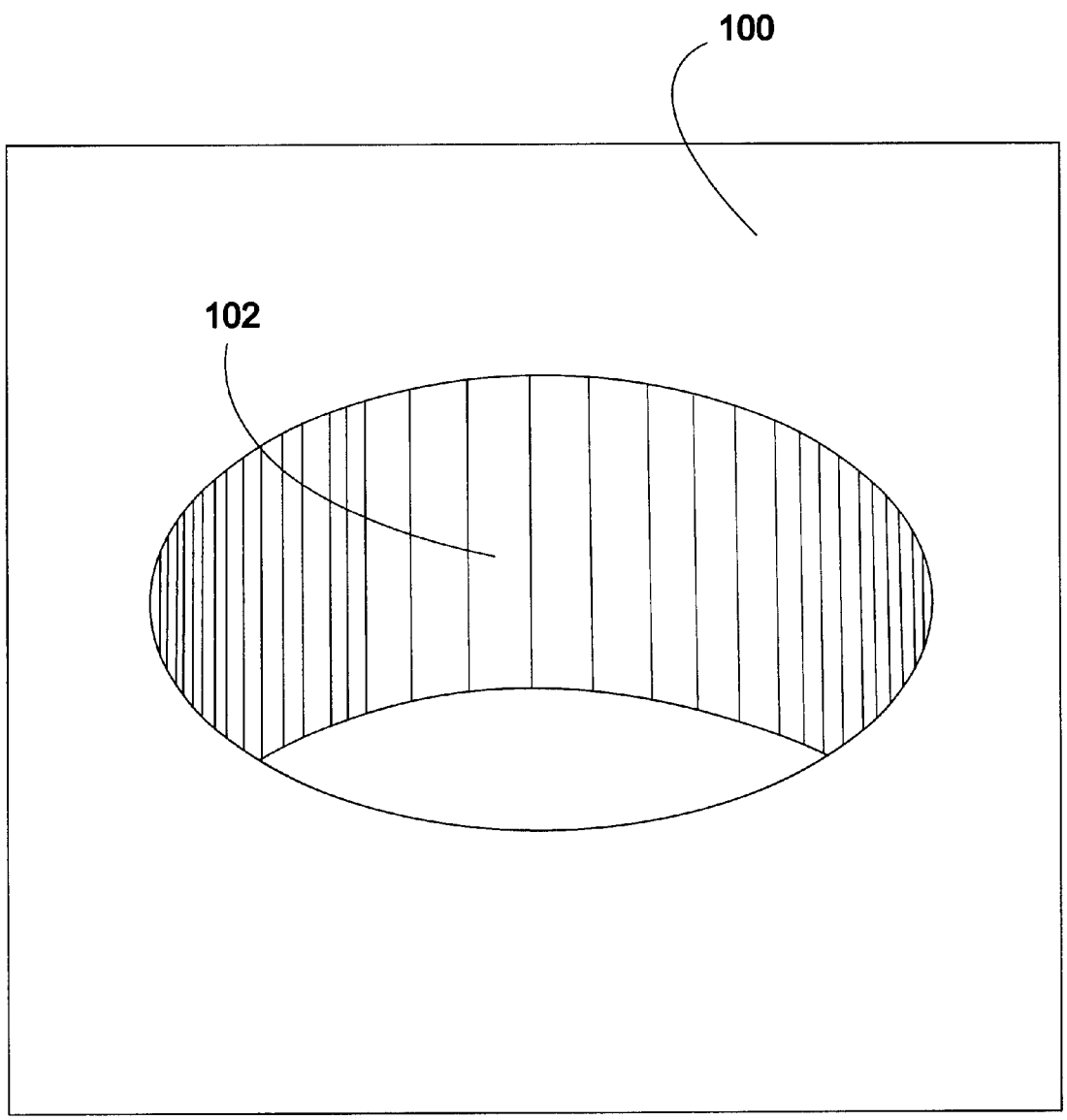
FIG. 2 is a close-up perspective view of an embodiment of one of the substrate holes from FIG. 1 according to the present invention.

FIG. 2 is a close-up perspective view of an embodiment of one of the substrate holes from FIG. 1 according to the present invention. A hole 102 in a substrate 100 is shown here.

Figure 3:
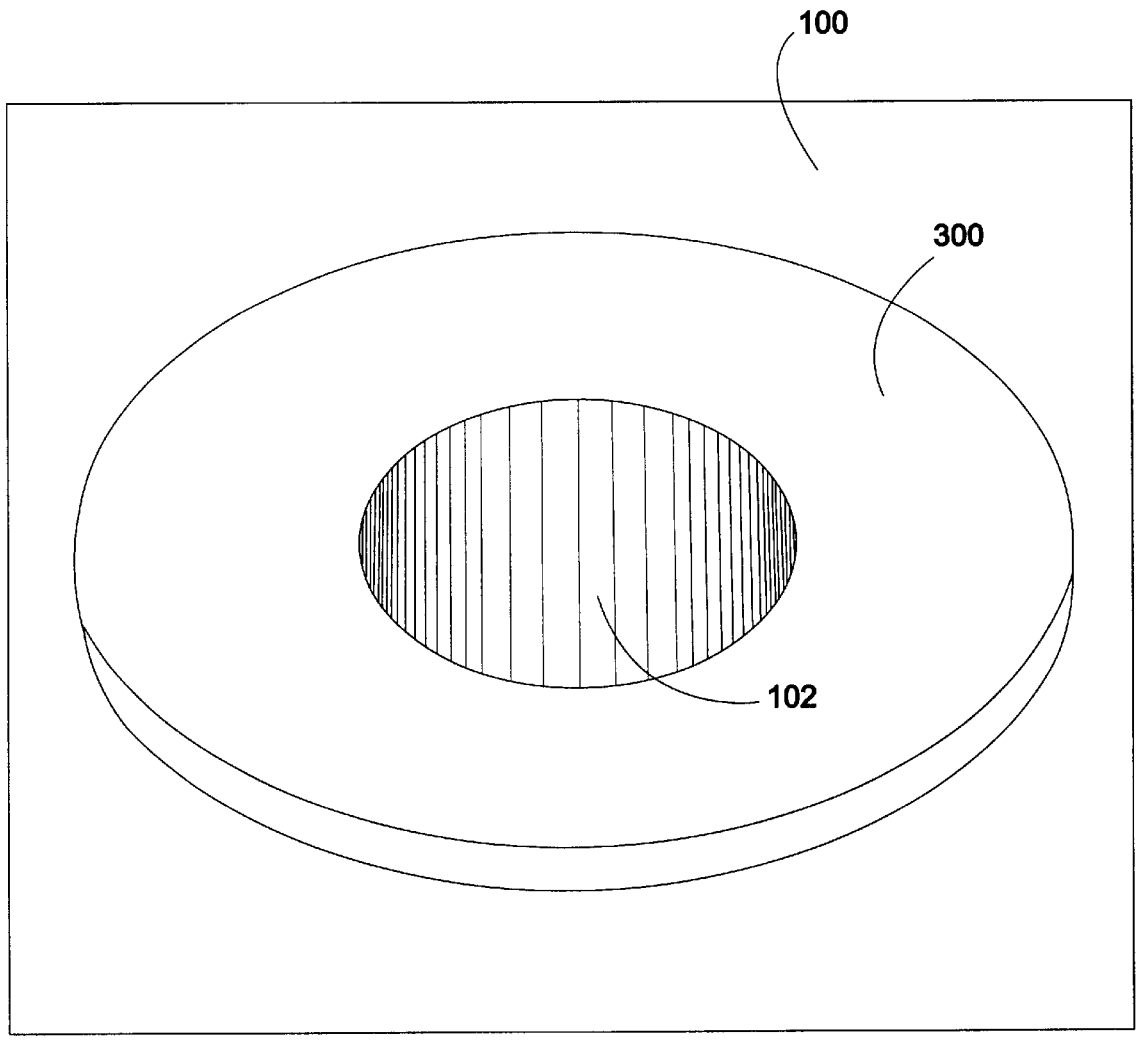
FIG. 3 is a perspective view of an embodiment of the structure of FIG. 2 after through plating and etching according to the present invention.

FIG. 3 is a perspective view of an embodiment of the structure of FIG. 2 after through-plating and etching according to the present invention. After through-plating, the hole 102 has a ring of metal plating 300 surrounding the hole 102 and through the hole 102 to the opposite side of the substrate 100. While the areas of metal plating 300 in this embodiment are circular in shape, other shapes of the areas of metal 300 will work equally well within the scope of the present invention. For example, in some embodiments of the present invention, the area of metal 300 may be elliptical, square, rectangular, or other, more complex shapes. While copper is a preferred metal for the metal plating, other example embodiments of the present invention may use other materials for the plating.

Figure 4:
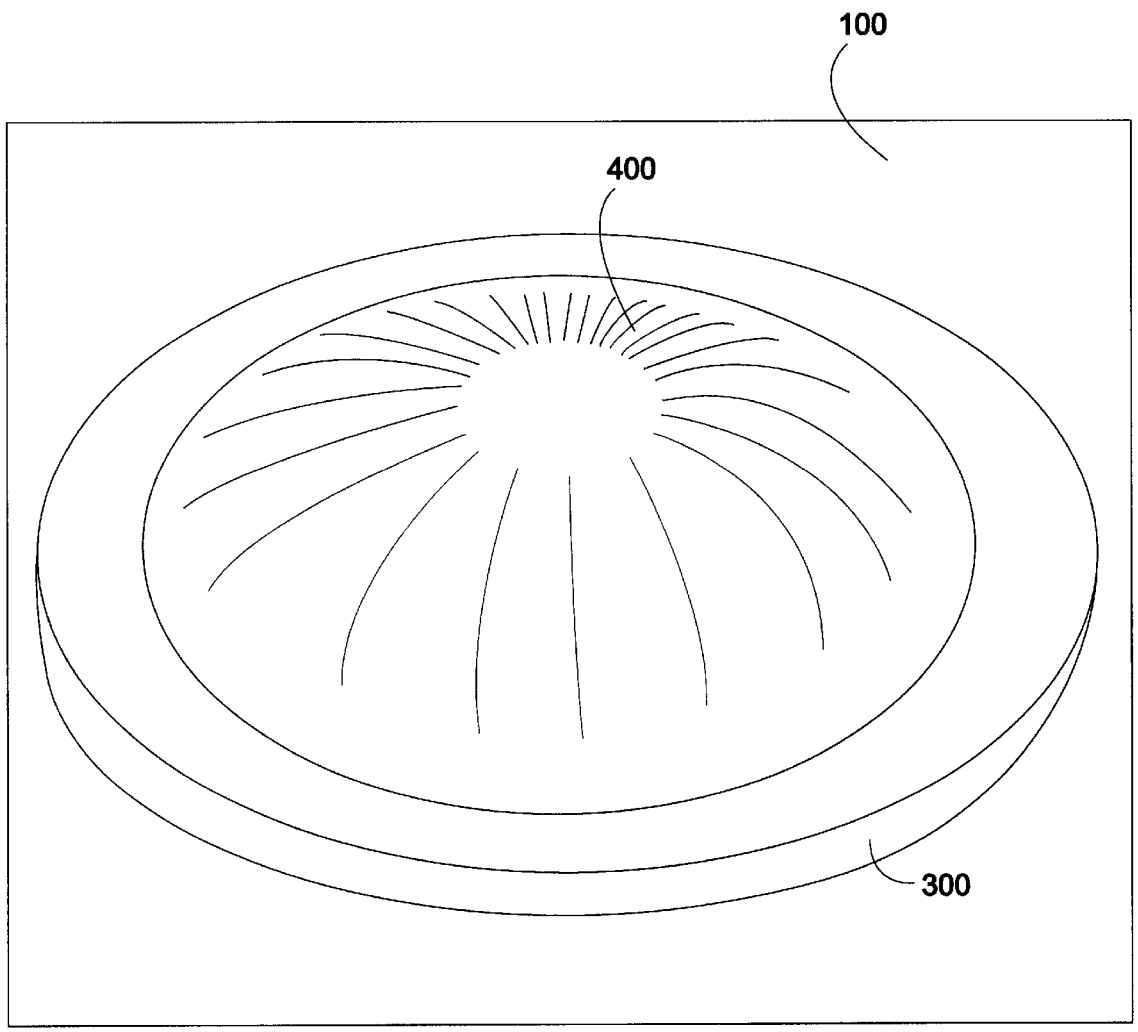
FIG. 4 is a perspective view of an embodiment of the structure of FIG. 3 with the addition of a molded dome according to the present invention.

FIG. 4 is a perspective view of an embodiment of the structure of FIG. 3 with the addition of a molded dome according to the present invention. A molded dome 400 is added to at least some of the through-plated holes 102.

Molded domes 400 may be added to none, some, or all of the through-plated holes 102 on each side of the substrate 100. In an example embodiment of the present invention, molded domes 400 are added to both sides of the substrate 100 to create a dual micro-spider interposer. A specialized electrical contact created pursuant to the present invention is referred herein to as a micro-spider contact, or simply as a micro-spider. In an alternate embodiment of the present invention, molded domes 400 are added to only one side of the substrate 100 to create a micro-spider/ball grid array (BGA) ball interposer.

Figure 5:
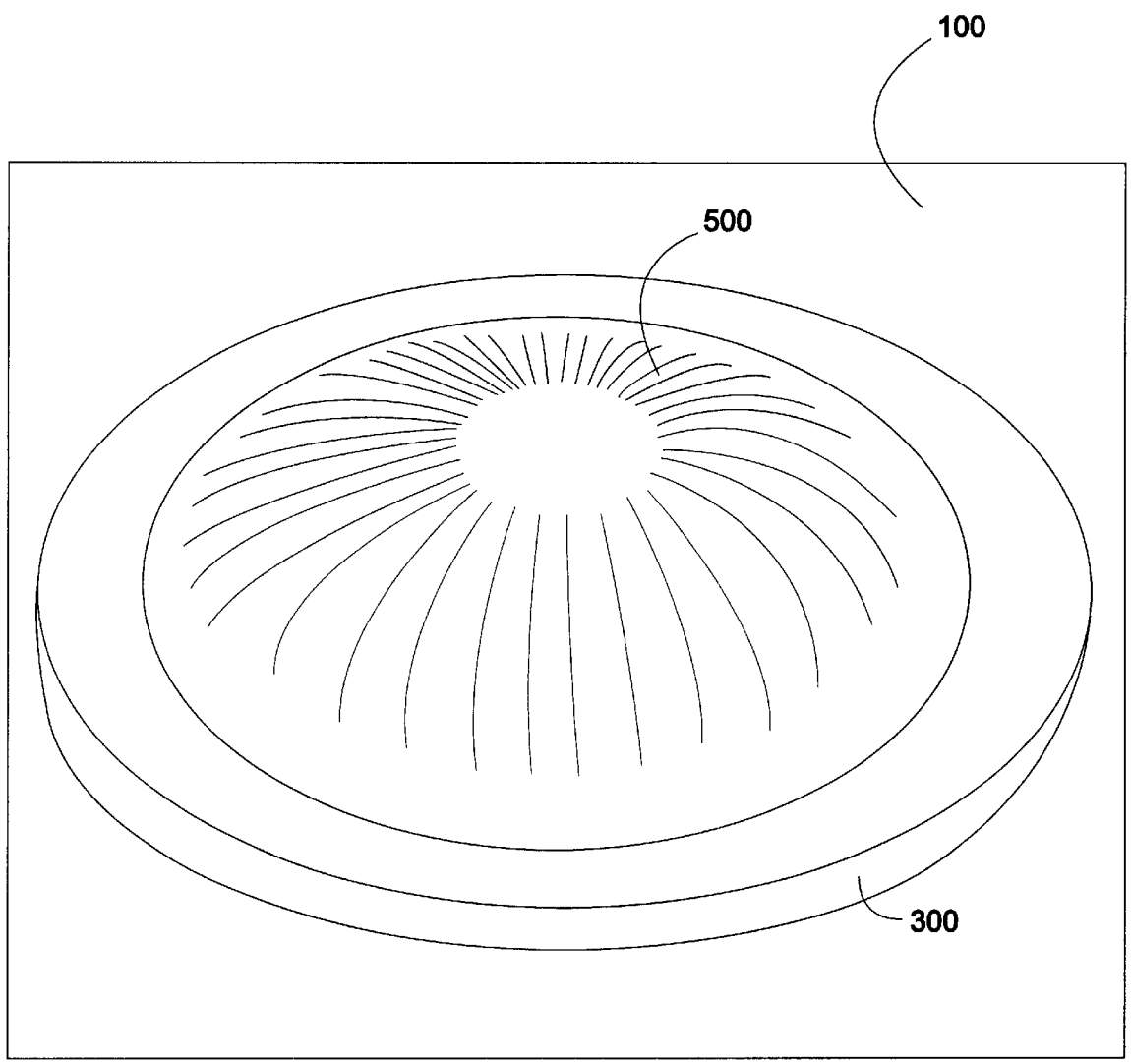
FIG. 5 is a perspective view of an embodiment of the structure of FIG. 4 after the dome has been metal plated according to the present invention.

FIG. 5 is a perspective view of an embodiment of the structure of FIG. 4 after the dome has been metal plated according to the present invention. The metal plated dome 500 of FIG. 5 may include copper or other metal elements or compositions according to design requirements.

Figure 6:
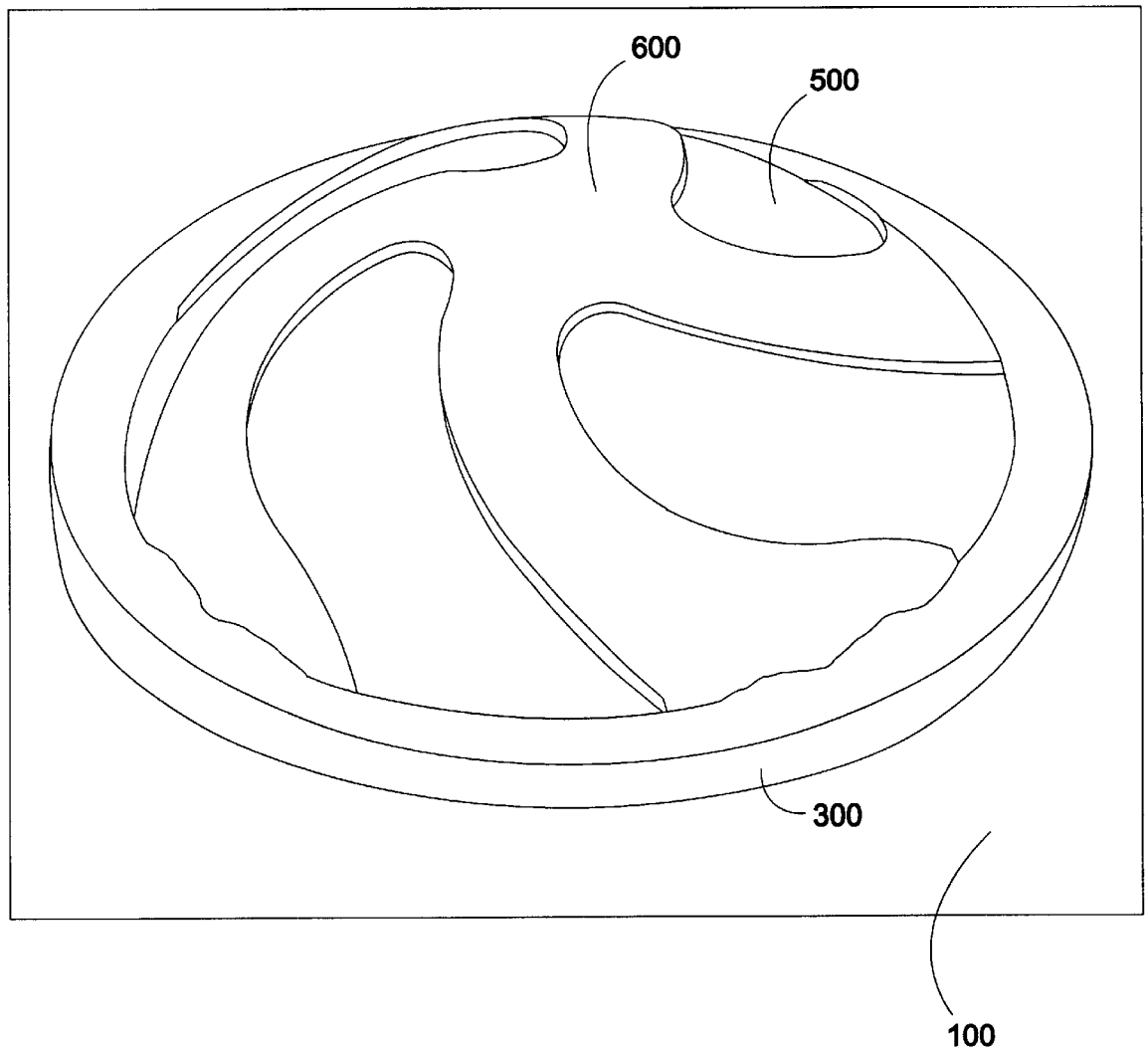
FIG. 6 is a perspective view of an embodiment of the structure of FIG. 5 after the addition of a mask layer according to the present invention.

FIG. 6 is a perspective view of an embodiment of the structure of FIG. 5 after the addition of a mask layer according to the present invention. A mask layer 600 in the shape of a clockwise micro-spider has now been added over the metal plated dome 500. The mask layer may comprise photoresist and be applied by any number of methods. The photoresist may be exposed and developed to produce the mask layer 600 in the shape of micro-spiders.

Figure 7:
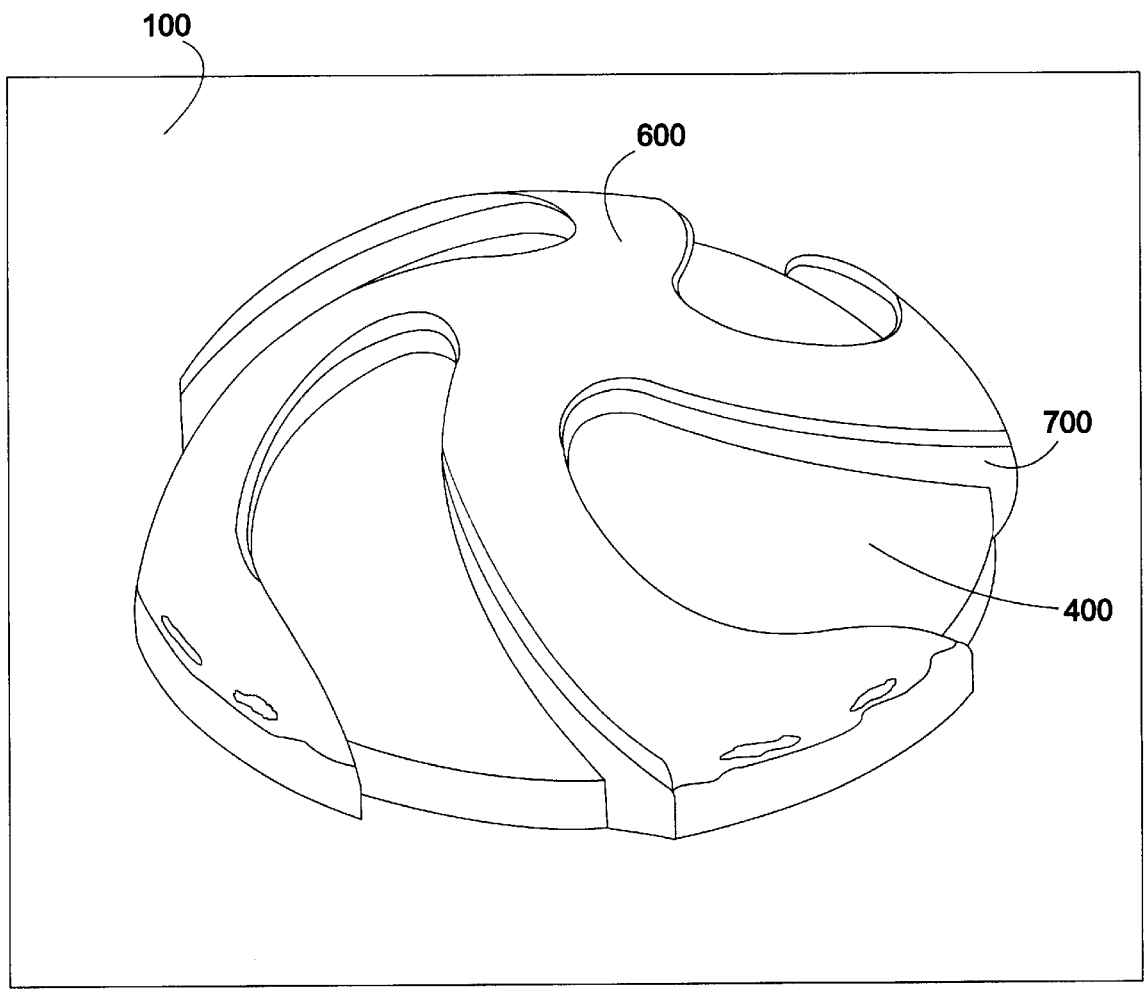
FIG. 7 is a perspective view of an embodiment of the structure of FIG. 6 after the metal layer has been etched away in all areas not covered by the mask layer according to the present invention.

FIG. 7 is a perspective view of an embodiment of the structure of FIG. 6 after the metal layer has been etched away in all areas not covered by the mask layer according to the present invention. An etched micro-spider 700, covered with the mask layer 600, is seen in place over the molded dome 400 on the substrate 100.

Figure 8:
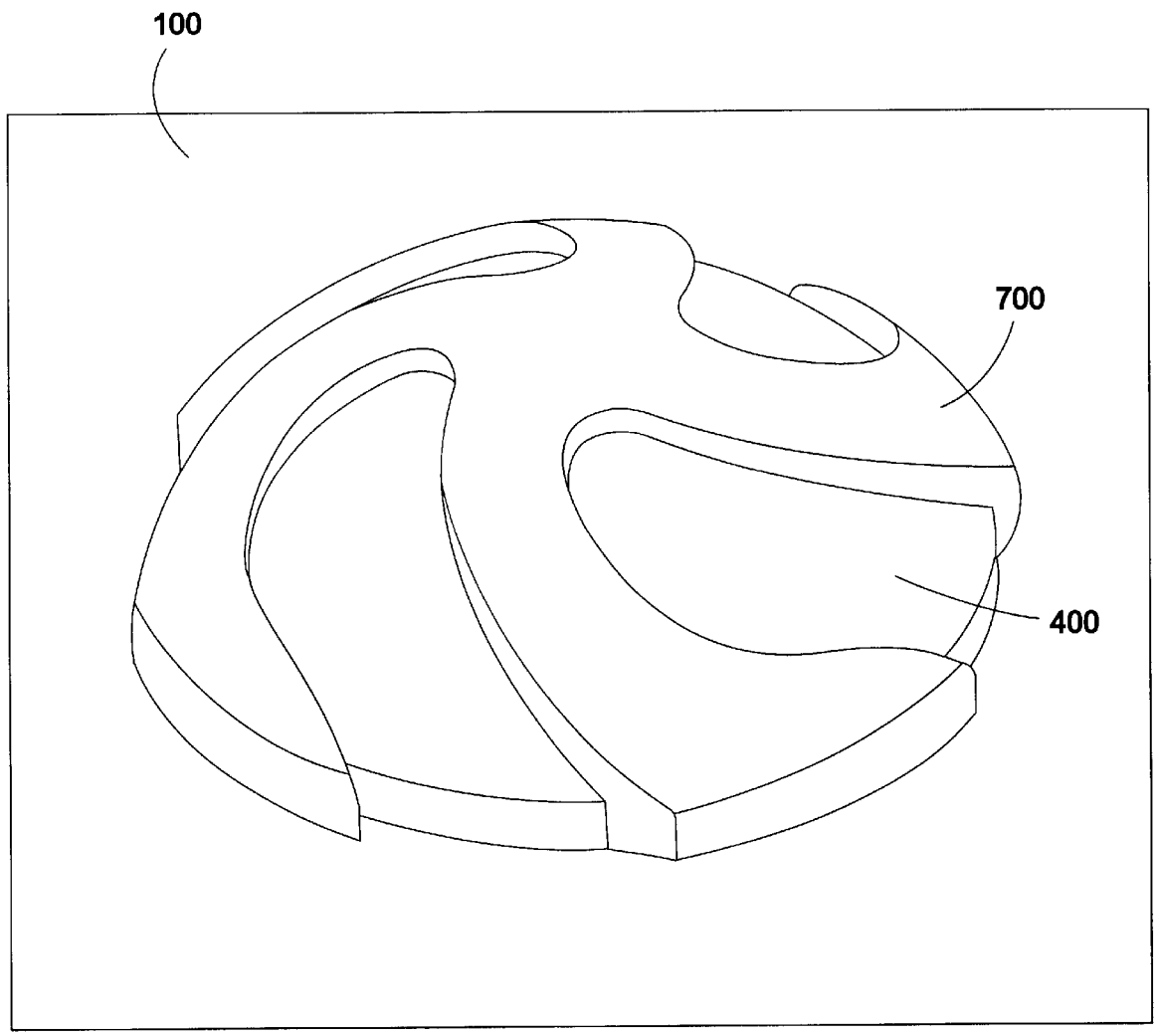
FIG. 8 is a perspective view of an embodiment of the structure of FIG. 7 after the mask layer has been removed according to the present invention.

FIG. 8 is a perspective view of an embodiment of the structure of FIG. 7 after the mask layer 600 has been removed from the micro-spider 700.

Figure 9:
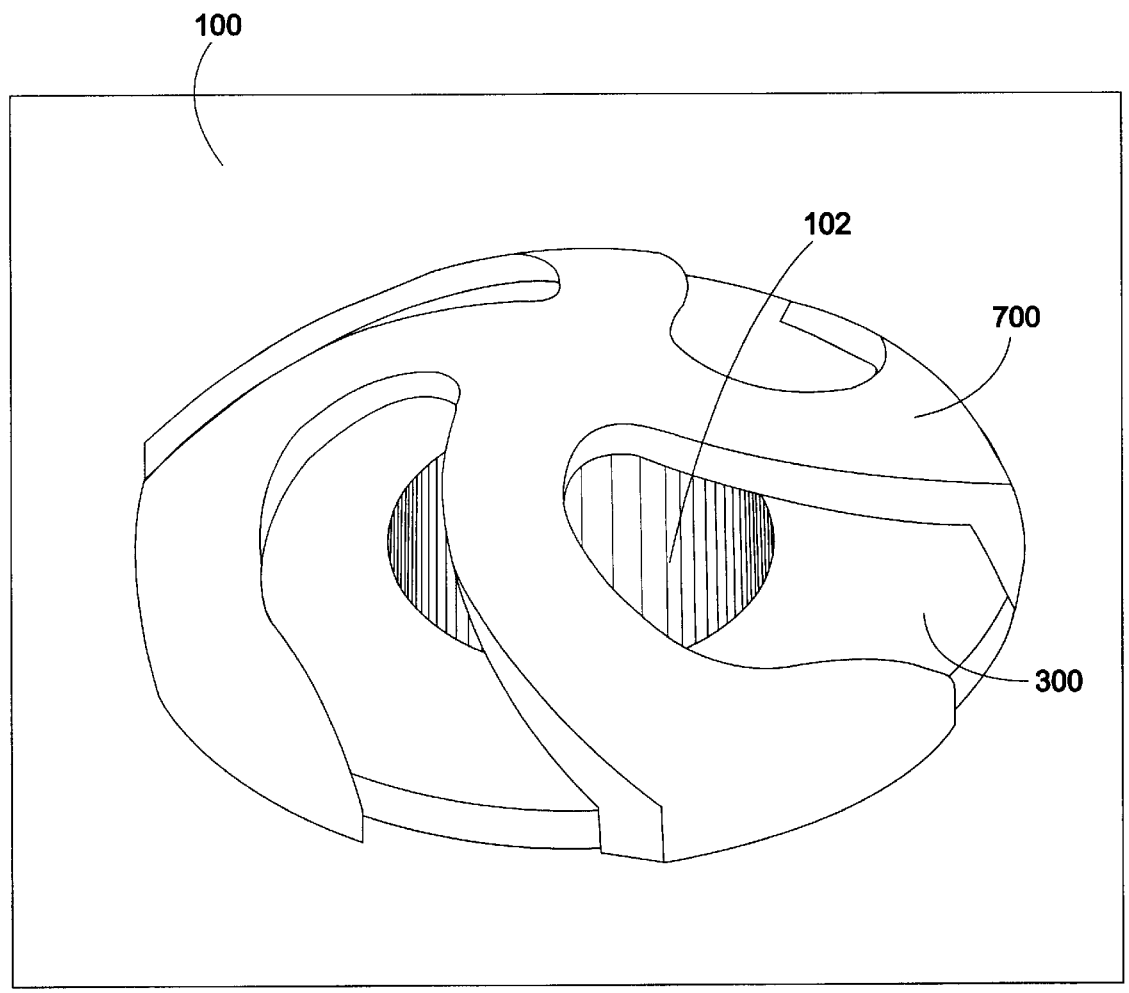
FIG. 9 is a perspective view of an embodiment of the structure of FIG. 8 after the dome has been dissolved according to the present invention.

FIG. 9 is a perspective view of an embodiment of the structure of FIG. 8 after the dome has been dissolved according to the present invention. The molded dome 400 may be preferably dissolved by any chemicals (or other etching method) capable of completely removing the dome material without damaging the micro-spider 700, plating 300, hole 102, or substrate 100.

Figure 10:
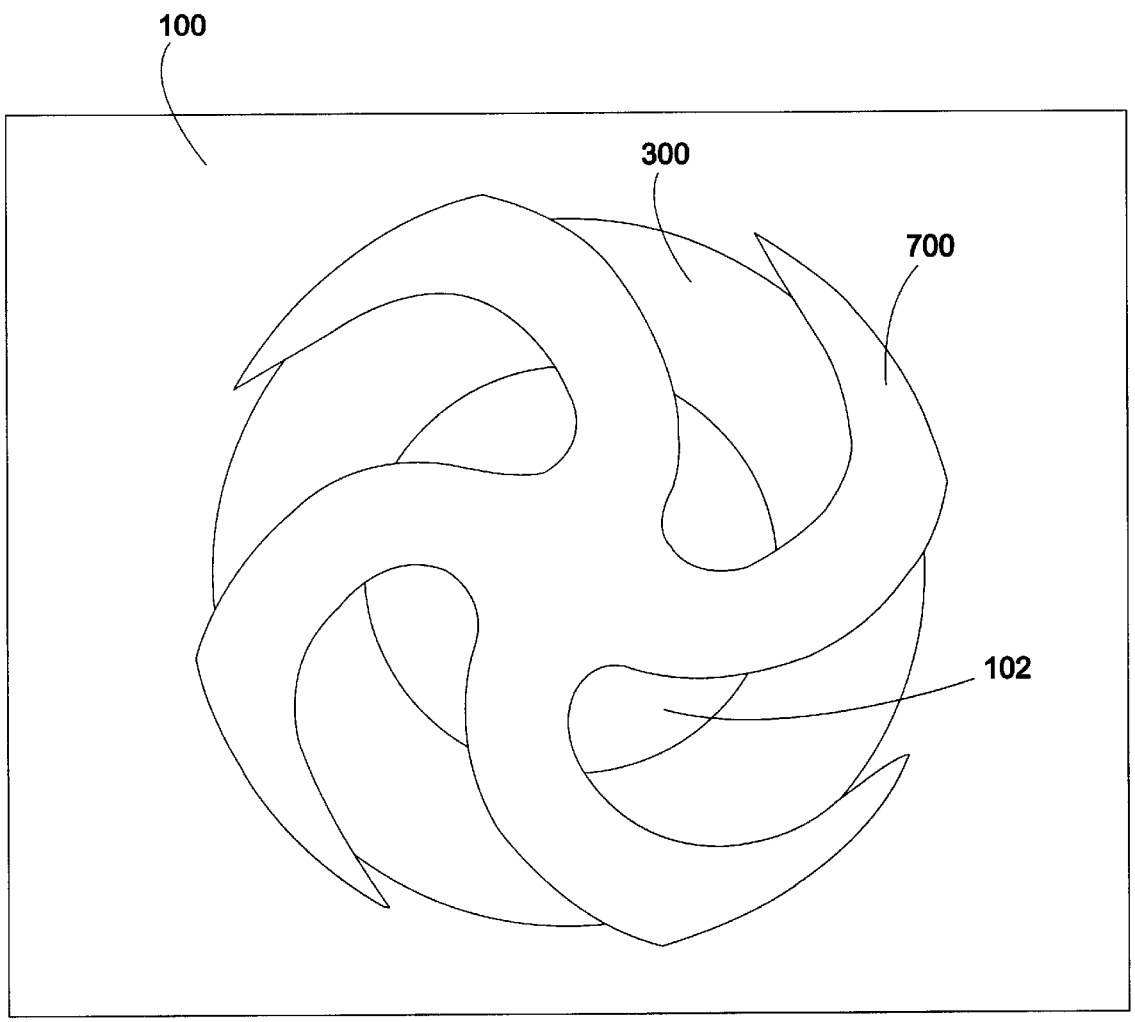
FIG. 10 is a top view of an embodiment of the final micro-spider contact structure from FIG. 9 according to the present invention.

FIG. 10 is a top view of an embodiment of the micro-spider contact structure from FIG. 9 according to the present invention. A single clockwise micro-spider 700 is shown over a through-hole 102 surrounded by metal plating 300 on a substrate 100. At this point the micro-spider may undergo further processing such as additional metal plating if desired. Also note that in other embodiments of the present invention counter-clockwise micro-spiders may be produced as desired. For example, it may be advantageous to design a large array of micro-spiders such that substantially equal numbers of clockwise and counter-clockwise micro-spiders are created. Such a design may reduce the rotational torque that would occur in an array of only clockwise or only counter-clockwise micro-spiders. Since the micro-spiders each rotate slightly, creating a wiping action on the contact during use, each micro-spider causes a small amount of torque on the device as it is connected.

The resulting micro-spiders are described further in a U.S. Pat. Ser. No. 09/917,361, "Electrical Contact", filed concurrently with the present application, and incorporated herein by reference. Another method for the fabrication of micro-spiders is described further in a U.S. Pat. Ser. No. 09/917,357, "Method for the Fabrication of Electrical Contacts", filed concurrently with the present application, and incorporated herein by reference.

Figure 11:
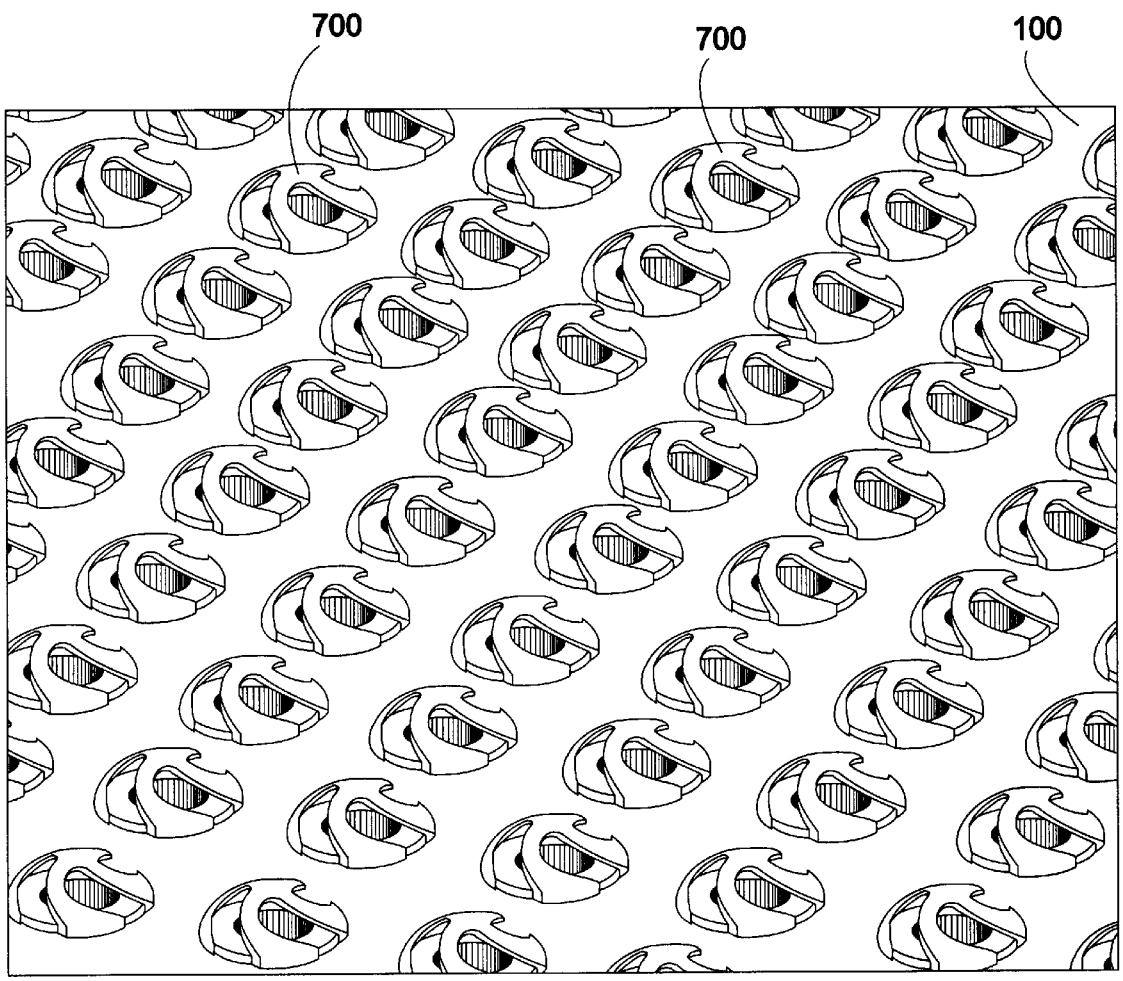
FIG. 11 is a perspective view of an embodiment of an array of clockwise micro-spiders according to the present invention.

FIG. 11 is a perspective view of an embodiment of an array of clockwise micro-spiders 700 shown over a substrate 100 according to the present invention. As disclosed above, in some embodiments of the present invention, it may be desired to alternate clockwise and counter-clockwise micro-spiders, for example in a checkerboard pattern.

Figure 12:
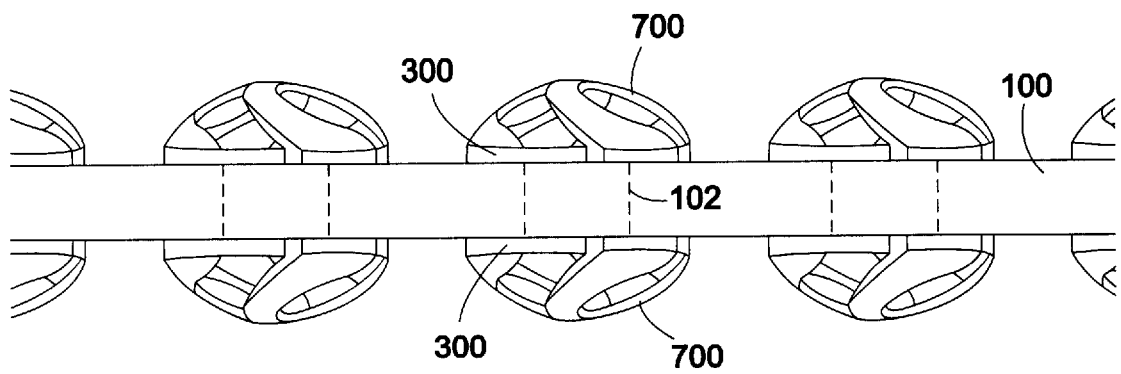
FIG. 12 is a cross-section view of an embodiment of a micro-spider interposer according to the present invention.

FIG. 12 is a cross-section view of an embodiment of a micro-spider interposer according to the present invention. In this example embodiment of the present invention micro-spiders are constructed on both sides of the substrate 100. Connecting each pair of micro-spiders 700 is a through-plated hole 102. The metal 300 surrounding each hole may be seen connecting to individual micro-spiders. While this example embodiment comprises clockwise micro-spiders 700 on the top of the substrate 100, and counterclockwise micro-spiders 700 on the bottom of the substrate 100 other configurations are possible within the scope of the present invention.

Figure 13A:
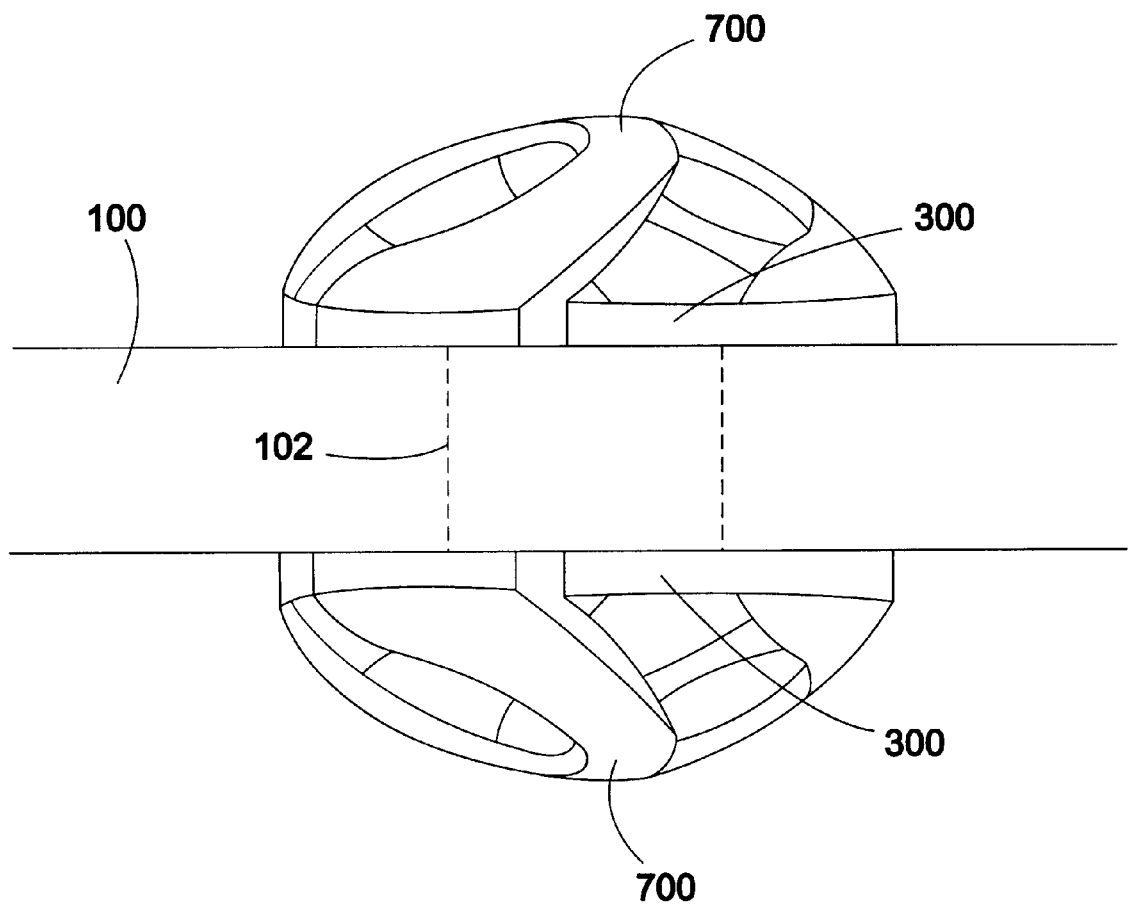
FIGS. 13A and 13B are cross-section views of embodiments of single micro-spider interposer pairs according to the present invention.
Figure 13B:
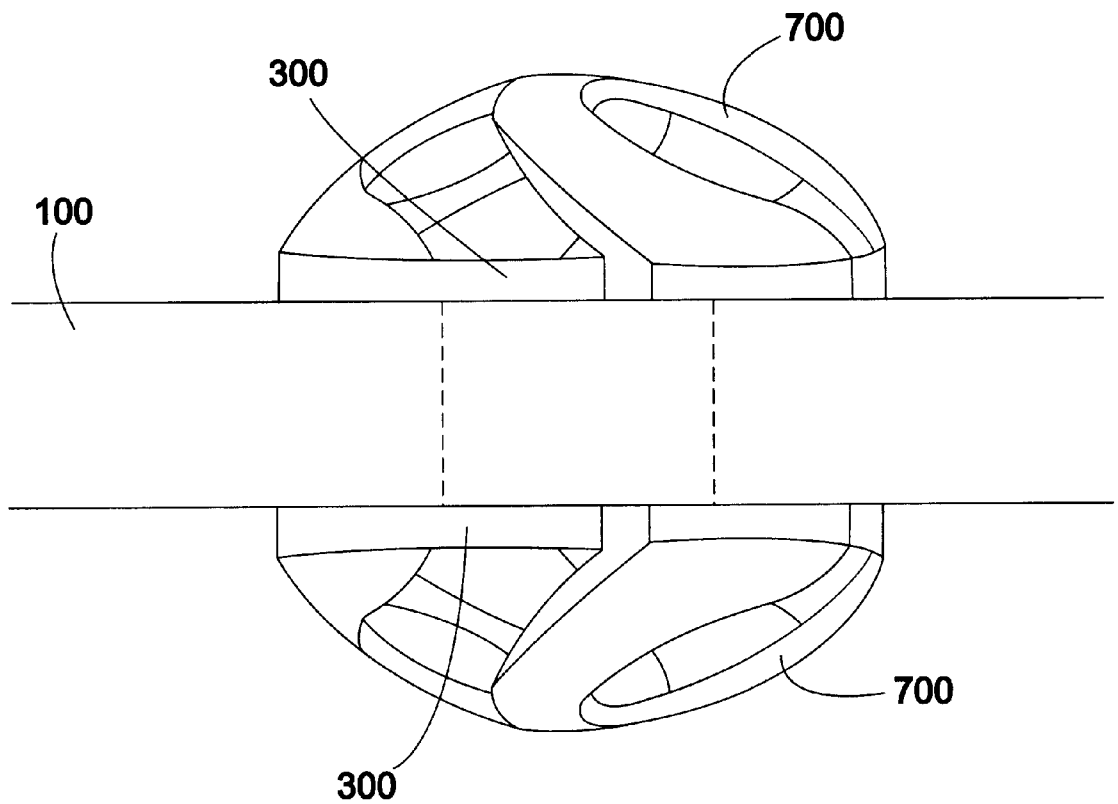

FIGS. 13A and 13B are cross-section views of embodiments of single micro-spider interposer pairs according to the present invention. In FIG. 13A a counterclockwise micro-spider 700 is shown on the top of the substrate 100, and a clockwise micro-spider 700 is shown on the bottom of the substrate 100. The pair of micro-spiders 700 are electrically connected by a through-plated hole 102 and the metal 300 surrounding the hole. In FIG. 13B a clockwise micro-spider 700 is shown on the top of the substrate 100, and a counter-clockwise micro-spider 700 is shown on the bottom of the substrate 100. The pair of micro-spiders 700 are electrically connected by a through-plated hole 102 and the metal 300 surrounding the hole.

Figure 14:
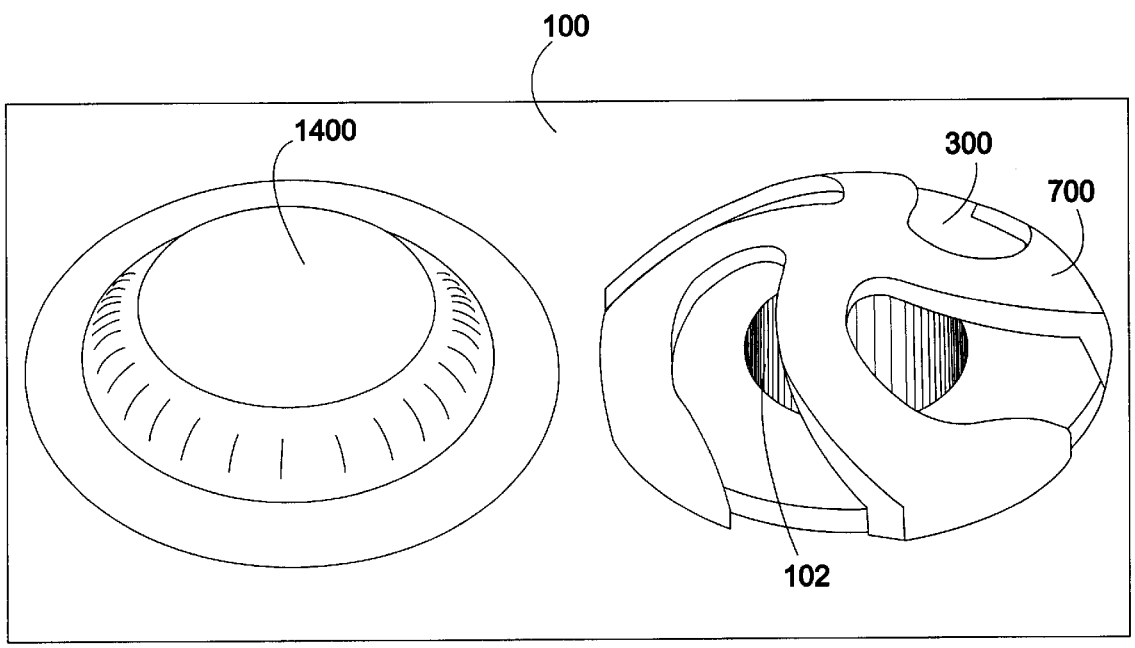
FIG. 14 is a view of an embodiment of a single clockwise micro-spider and a single micro stop according to the present invention.

FIG. 14 is a perspective view of an embodiment of a single clockwise micro-spider 700 electrically connected to the metal 300 surrounding a hole 102 in the substrate 100 next to a micro stop 1400 in accordance to the present invention. The micro stop 1400 may be constructed using processes similar to standard printed circuit board processes, to create an elevated stop configured to prevent over-compression of the micro-spiders 700 during use. The height of the micro stop 1400 preferably enables compression and contact wiping action of the micro-spiders 700 while preventing over-compression that would physically damage the micro-spiders 700.

Figure 15:
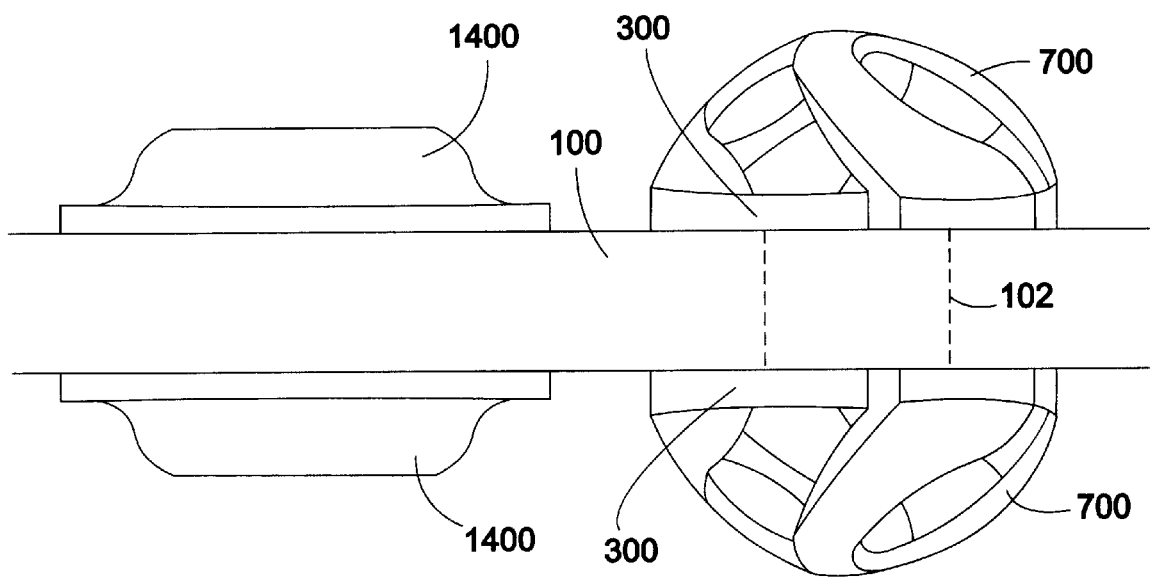
FIG. 15 is a cross-section view of an embodiment of the structure from FIG. 14 according to the present invention.

FIG. 15 is a cross-section view of an embodiment of the structure from FIG. 14 according to the present invention. In this example embodiment of the present invention a micro-spider interposer including a pair of micro stops 1400 is shown in cross-section view. The clockwise micro-spider 700 on top of the substrate 100 is electrically connected to the counter-clockwise micro-spider 700 on the bottom of the substrate through the metal 300 surrounding the through-plated hole 102 in the substrate 100.

Figure 16:
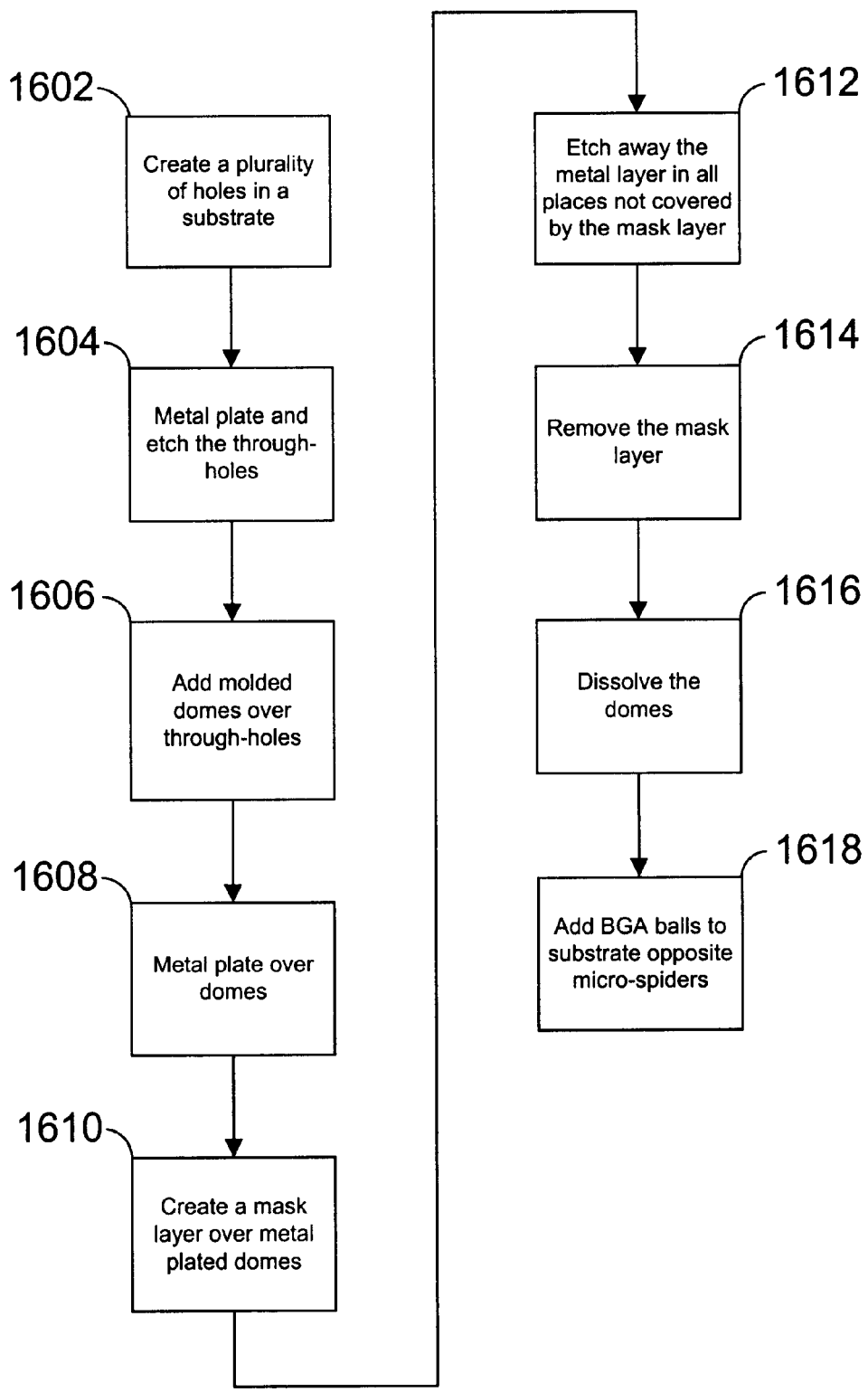
FIG. 16 is a flowchart of a method of creating micro-spider contacts according to the present invention.

FIG. 16 is a flowchart of a method of creating micro-spider contacts according to the present invention. In a step 1602, a plurality of holes 102 are created in a substrate 100. In a step 1604, the holes 102 are through-plated and etched. In a step 1606, molded domes are created over the through-plated holes 102. In a step 1608, the substrate 100 with the holes 102 covered by molded domes is metal-plated. In a step 1610, a mask layer in the configuration of micro-spiders is created over the metal-plated domes. In a step 1612, the metal-plating is etched away in all the places not covered by the mask layer. In a step 1614, the mask layer is removed. In a step 1616, the domes are dissolved or etched away leaving the finished micro-spiders. If desired, the micro-spiders may be metal-plated again with one or more additional metals, such as nickel or gold, at this point in the process. In an optional step 1618, ball grid array (BGA) balls are placed on the through-plated holes 102 on a side of the substrate 100 opposite to the micro-spiders 700. In such an embodiment of the present invention, micro-spiders 700 are placed on one side of the substrate 100 and BGA balls 1900 are placed on the other side of the substrate 100 producing a micro-spider/BGA interposer.

Figure 17:
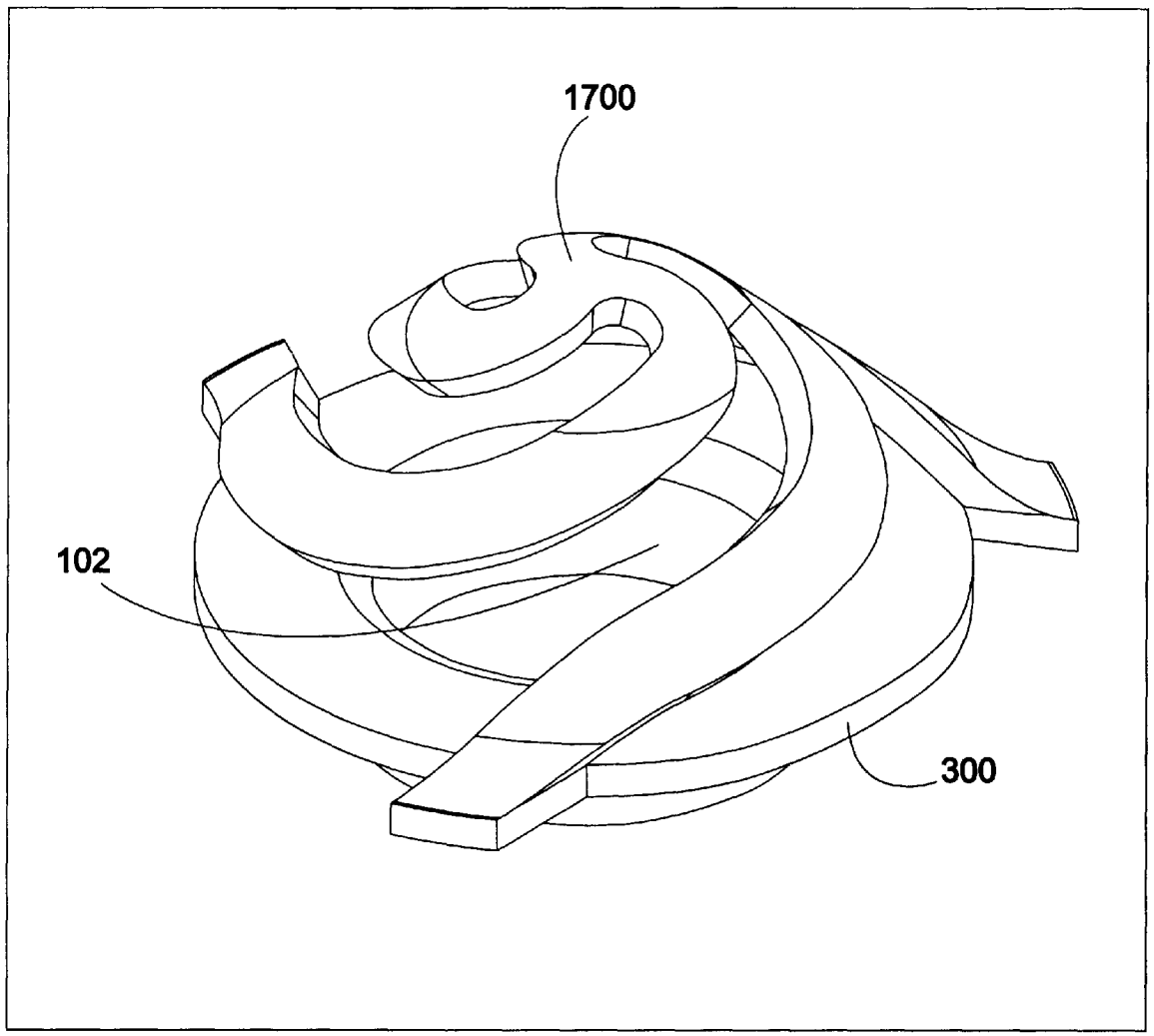
FIG. 17 is a perspective view of an embodiment of a three-legged micro-spider.

FIG. 17 is a perspective view of an embodiment of a three-legged micro-spider according to the present invention. A three-legged micro-spider 1700 is shown connected to the metal 300 surrounding a through-plated hole 102 in a substrate 100. Micro-spiders may be constructed with any number of legs (greater than one) as desired by an intended use, within the scope of the present invention.

Figure 18:
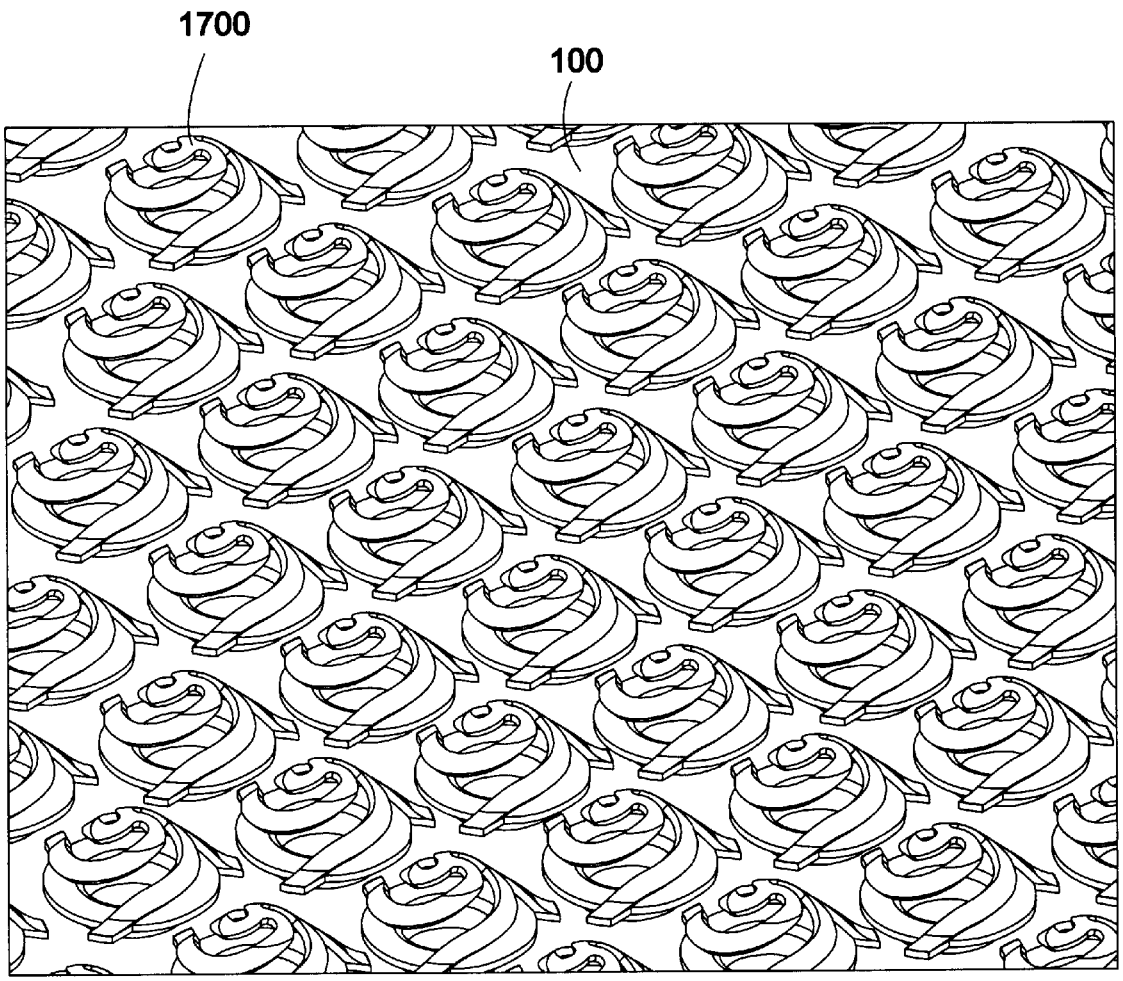
FIG. 18 is a perspective view of an embodiment of a plurality of three-legged micro-spiders on a substrate according to the present invention.

FIG. 18 is a perspective view of an embodiment of a plurality of three-legged micro-spiders on a substrate according to the present invention. FIG. 18 shows an array of three-legged micro-spiders 1700 on a substrate 100. While this figure shows a regular array of micro-spiders 1700, other embodiments of the present invention may use an irregular array of micro-spiders 1700 as desired by the intended use of the plurality of micro-spiders 1700.

Figure 19:
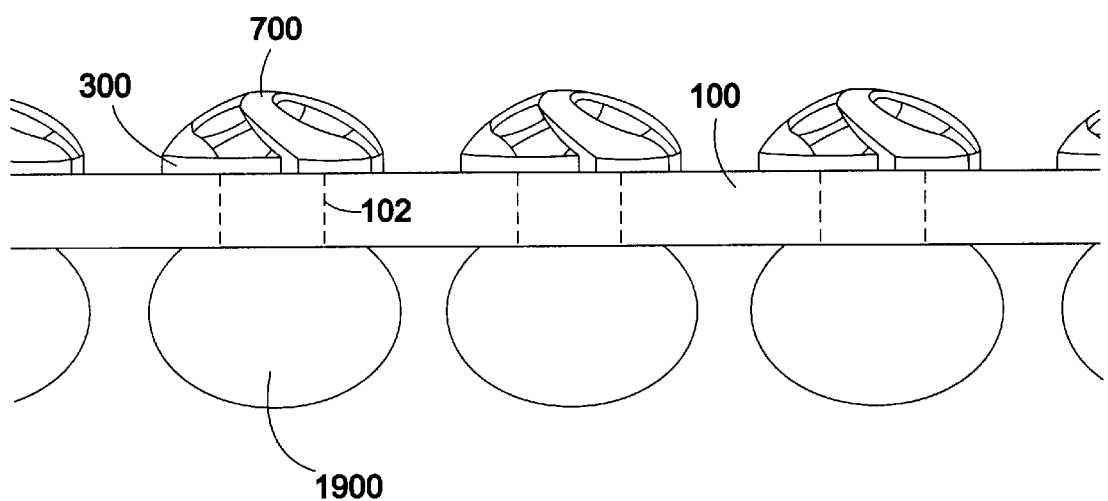
FIG. 19 is a cross-section view of an embodiment of a micro-spider/ball grid array interposer according to the present invention.

In a specific example embodiment of the present invention, micro-spiders 700 are preferably constructed on a first side of the substrate 100 and ball grid array balls 1900 are preferably constructed on a second side of the substrate 100, creating an interposer for use in non-permanently attaching electronic devices such as a multi-chip module (MCM) to a circuit board. FIG. 19 is a cross-sectional view of such an embodiment. The example embodiment of the present invention shown in FIG. 19 illustrates a plurality of micro-spiders 700 constructed on a first side of a substrate and ball grid array (BGA) balls 1900 placed on a second side of a substrate 100, connected together by through-plated holes 102 surrounded by areas of metal 104 contacting the micro-spiders 300. This example embodiment of the present invention may be employed as an interposer for use in non-permanently attaching electronic devices, such as a MCM, to a circuit board, while the interposer is attached to the circuit board by the BGA balls 1900. This example embodiment of the present invention may be fabricated using the process described in connection with FIG. 16 including optional step 1618.

What is claimed is:

1. A method for the fabrication of electrical contacts, comprising the steps of:
    a) through-plating a plurality of vias in a substrate;
    b) creating domes over at least some of said through-plated vias;
    c) first metal plating said domes;
    d) masking said domes;
    e) etching away said first metal plating on said domes in areas not covered by said mask creating a plurality of electrical contacts, wherein said electrical contacts include spiraling legs configured to create a wiping action on metal pads when compressed; and
    f) dissolving said domes.

2. The method for the fabrication of electrical contacts of claim 1, wherein said substrate includes metal pads surrounding substantially all locations of said vias before said vias are created in said substrate.

3. The method for the fabrication of electrical contacts of claim 1, further comprising the step of:
    g) second metal plating said electrical contacts after said step of first metal plating.

4. The method for the fabrication of electrical contacts of claim 3, wherein said second metal plating includes gold.

5. The method for the fabrication of electrical contacts of claim 3, wherein said second metal plating includes nickel and gold.

6. The method for the fabrication of electrical contacts of claim 1, further comprising the step of:
    g) second metal plating said electrical contacts after said step of dissolving said domes.

7. The method for the fabrication of electrical contacts of claim 6, wherein said second metal plating includes gold.

8. The method for the fabrication of electrical contacts of claim 6, wherein said second metal plating includes nickel and gold.

9. The method for the fabrication of electrical contacts of claim 1, further comprising the step of:
    g) removing said mask layer after said step of etching said first metal plating.

10. The method for the fabrication of electrical contacts of claim 1, wherein said first metal plating is copper.

11. The method for the fabrication of electrical contacts of claim 1, wherein said substrate is a printed circuit board substrate.

12. The method for the fabrication of electrical contacts of claim 1, wherein at least some of said electrical contacts are on opposite sides of said substrate.

13. The method for the fabrication of electrical contacts of claim 1, further comprising the step of:
    g) adding a plurality of ball grid array balls to said through-plated holes on a side of said substrate opposite to said electrical contacts.

14. The method for the fabrication of electrical contacts of claim 1, further comprising the step of:
    i) forming at least one micro stop on said substrate.

* * * * *